United States Patent [19]

Atallah

[11] Patent Number: 5,111,081
[45] Date of Patent: May 5, 1992

[54] PROCESS COMPENSATED INPUT SWITCHING THRESHOLD OF A CMOS RECEIVER

[75] Inventor: Francois I. Atallah, Releigh, N.C.

[73] Assignee: International Business Machines Corporation, Armonk, N.Y.

[21] Appl. No.: 630,576

[22] Filed: Dec. 20, 1990

[51] Int. Cl.⁵ .................. H03K 19/017; H03K 5/153; H03K 19/092; H03K 19/094
[52] U.S. Cl. .................................... 307/475; 307/451; 307/443
[58] Field of Search .................. 307/443, 362–364, 307/310, 451, 475, 263, 356

[56] References Cited

U.S. PATENT DOCUMENTS

| | | | |
|---|---|---|---|
| 4,794,283 | 12/1988 | Allan et al. | 307/475 |
| 4,845,388 | 7/1989 | Amatangelo | 307/475 |
| 4,855,623 | 8/1989 | Flaherty | 307/451 |
| 4,975,599 | 12/1990 | Petrovick, Jr. | 307/443 |

Primary Examiner—Stanley D. Miller
Assistant Examiner—Andrew Sanders
Attorney, Agent, or Firm—Joscelyn G. Cockburn

[57] ABSTRACT

Described is a circuit arrangement which controls the range of input voltages at which the output of a CMOS inverter switches. The circuit arrangement includes a plurality of FET devices disposed in parallel with one of the CMOS inverter devices. The FET devices are selectively switched to adjust the (W/L) ratio of said one of the CMOS inverter devices. Therefore, as the switching threshold of the inverter changes due to tempeature, process variations, etc., the (W/L) ratio of the said one of the CMOS inverter devices is adjusted to compensate for the changes.

13 Claims, 1 Drawing Sheet

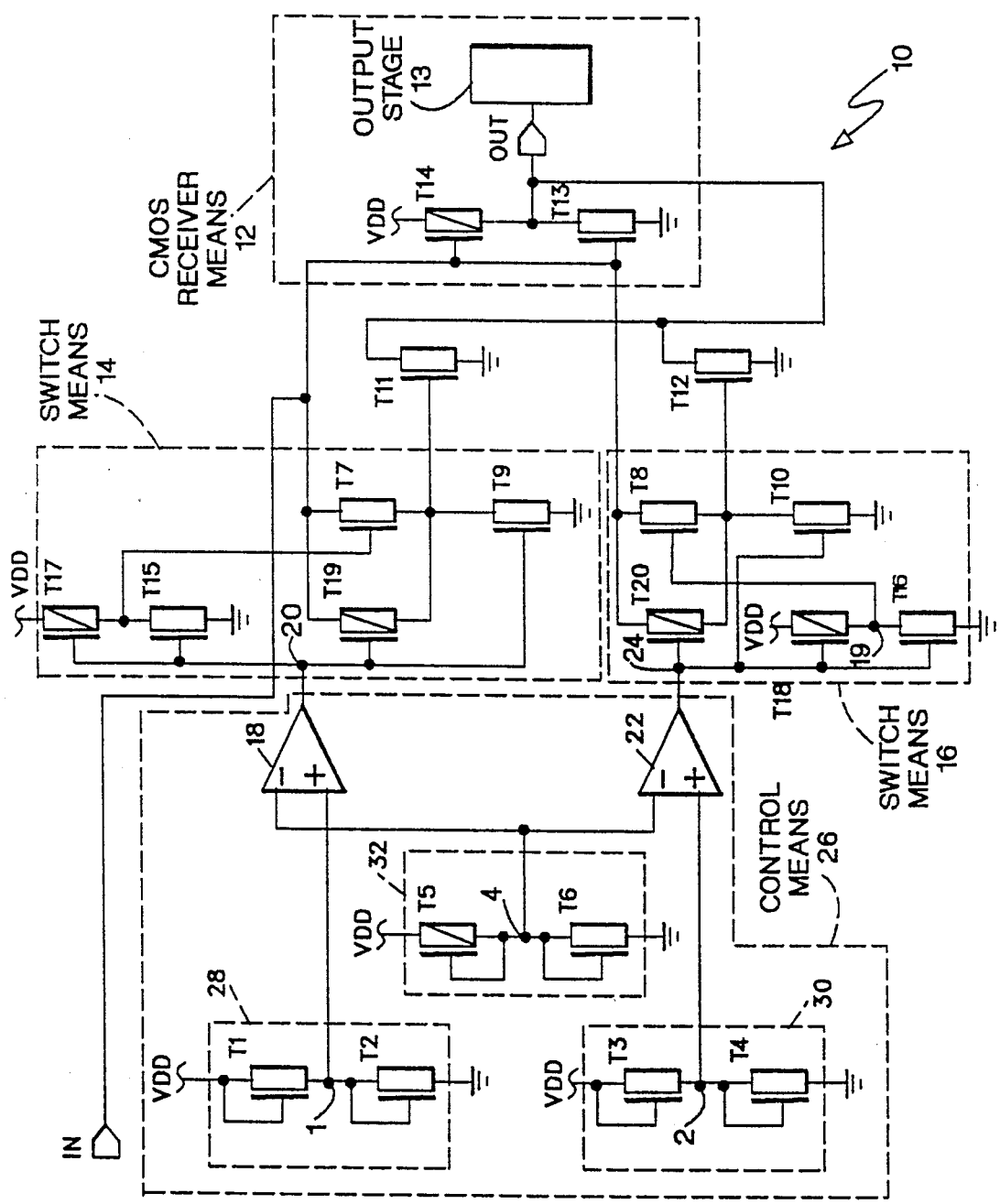

PROCESS COMPENSATED INPUT SWITCHING THRESHOLD OF A CMOS RECEIVER

BACKGROUND OF THE INVENTION

Background of the Invention

1. Field of the Invention

The present invention relates to LSI technology in general and in particular to CMOS receivers that receive signals from other circuit families such as TTL.

2. Prior Art

It is well known in the prior art to use a CMOS receiver to interface other circuit families including TTL logic with CMOS logic. The first stage of most CMOS receivers is a simple CMOS inverter consisting of a PFET device connected in series to a NFET device. Depending on process variation, among other things, the input voltage at which the output of the CMOS inverter switches can vary as much as 700 or 800 mV. Due to this variation, the switch point of the CMOS inverter tends to be unstable. The instability has an adverse effect on the use of the CMOS inverter to interface TTL circuits with CMOS circuits.

The straightforward approach for designing the input stage of the CMOS receiver is to set the switch point of the input stage to be halfway between $V_{IL}$ and $V_{IH}$, where $V_{IL}$ represents the low input voltage and $V_{IH}$ represents the high input voltage, of the logic technology to which the input stage is connected. In the case of TTL input logic signals, the switch point of the CMOS inverter is set at approximately 1.4 volts. The TTL signals also have excursions about the 1.4V switch point. The excursions provide noise immunity for the TTL signals. Stated another way, the excursions allow the TTL circuit to function satisfactorily in relatively noisy environments. However, if TTL circuits are interfaced with CMOS logic circuits the inherent excursions which occur about the threshold switch point of the CMOS inverter reduce or even eliminate the TTL noise margin. Therefore, there is a need to provide a device which stabilizes the threshold switch point of the CMOS receiver.

U.S. Pat. Nos. 4,584,492 and 4,673,021 describe circuit arrangements with feedback systems which compensate and/or stabilize the switch point of a CMOS inverter. Even though the patents work well for their intended purposes, the circuit arrangements use relatively large areas of silicon chips. In addition, the feedback loops have to be stabilized over all operating frequencies and temperature ranges.

U.S. Pat. No. 4,719,369 sets forth a driver circuit in which the gate width of the output transistors in a series connected PFET device and NFET device is regulated so that the output resistance of said drive circuit matches the impedance of the driven transmission line.

U.S. Pat. No. 4,424,456 describes a CMOS driver circuit for driving a CCD load. The rise and fall times of the drive pulses are controlled to generate pulses that are more effective in driving the CCD load. In one of the embodiments, the fall time of the pulses is controlled by setting the overall value of the (W/L) ratio of transistors in the discharge path.

SUMMARY OF THE INVENTION

It is, therefore, an object of the invention to provide a compensation circuit arrangement which narrows the voltage range over which the output of a CMOS inverter switches for a given input signal.

The compensation circuit arrangement is based on the principle that the switching threshold of a series-connected CMOS inverter pair is dependent on the width to-length (W/L) ratio of the PFET and NFET devices.

With this principle in mind, the compensated circuit arrangement includes a plurality of FET devices connected in parallel to the FET devices forming CMOS inverter pair. Each of the plurality of FET devices is coupled to a switch that activates the device if it is closed or if it is opened, the FET device is coupled to a ground potential. Each switch is controlled by signals generated by a controller.

The controller includes a first reference voltage generator whose reference threshold is set to switch the maximum range allowed by the CMOS process. Two other voltage generators, with thresholds set to switch at values less than the maximum range allowed by the CMOS process, are also provided. The outputs from respective reference voltage generators are compared with the output from the first reference voltage generator. The signals resulting from the comparison drives the switches.

These and other objects and advantages of the invention will be more fully described in the accompanying drawings.

BRIEF DESCRIPTION OF THE DRAWINGS

The sole FIGURE shows a schematic of the improved circuit arrangement according to the teachings of the present invention.

DETAILED DESCRIPTION OF THE PREFERRED EMBODIMENT

The sole FIGURE shows a compensation circuit 10 according to the teachings of the present invention. The compensation circuit 10 adjusts the spread in the switching threshold of CMOS receiver means 12 so that it falls within an acceptable range. As a result, signals from drive circuit (not shown) such as TTL logic, when applied to the terminal labeled "IN" maintained its noise immunity.

Still referring to the sole FIGURE, the CMOS receiver means 12 includes an input stage which is formed by P-channel FET device T14 connected by its source electrode to the drain electrode of N-channel FET device T13. A node labeled Out, positioned between T13 and T14, interconnects the input stage of the CMOS receiver means to the output stage 13 of the CMOS receiver means 12. A plurality of FET devices, only two (T11 and T12) of which are shown in the sole drawing, are connected by their drain electrodes to the node labeled OUT. As will be explained subsequently, the purposes of the plurality of FET devices is to adjust the width-to-length (W/L) ratio of device T13 so that the switching threshold of the input inverter of the CMOS receiver is adjusted as the switching threshold varies due to variations in process parameters, etc. It should be noted that even though only two devices are shown, any desired number of FET devices can be tied to the node labeled "OUT" without departing from the scope or spirit of the present invention. By switching the parallel devices in and out of the circuit, the width-to-length ratio of T13 is adjusted and the switching threshold level of the input inverter stage of the CMOS receiver is adjusted. To this end, the gate electrode of devices T11 and T12 are tied through switch means 14 and 16 to the input terminal labeled "IN". With this configuration, if the switches are closed, the respective gate electrodes of device T11 and T12 are connected to the input of the receiver. If the switches are opened, the gate electrodes are connected to a reference potential, such as ground, to shut them off. If the CMOS process, temperature, power supply, etc., are such as to have the switching threshold of the inverter pair low, the switches tied to the gate electrodes of T11 and T12 will connect to ground, thus turning off the devices and leaving T13 with a relatively small width-to-length (W/L) ratio to set the switching threshold level of the input or inverter stage. As the switching threshold begins to shift upward, T11 and T12 will turn on successively to increase the width-to-length (W/L) ratio of T13. It should be noted that if more accurate switching is desired, additional number of devices which will turn on or off for small fluctuation of the switching threshold can be connected to the node labeled OUT. Each of the added devices would be connected by appropriate switching means to the node labeled IN.

Still referring to the sole FIGURE, switch means 14 includes an inverter formed from FET devices T15 and T17. A node intermediate the FET devices T15 and T17 are coupled to the gate electrode of N-channel FET device T7. The drain electrode of P-channel FET device T7 is connected to the drain electrode of a P-channel FET device T19, a node labeled IN and the gate electrode of the CMOS inverter T14 and T13. The source electrode of T7 is connected to the gate electrode of T11 and the drain electrode of T9. The source electrode of T9 is coupled to a reference potential such as ground. The input to the inverter formed by devices T17 and T15 are connected to the gate electrode of device T19. The source electrode of device T19 is connected to the source electrode of device T7. In operation, when a signal is outputted from comparator 18 to node 20 device T19 which is a P-channel device is activated and the signal is inverted so as to activate N-channel device T7. With T7 and T19 activated, the switch is on and device T11 is coupled to the input node (IN) of the circuit. Thus, the effective width-to-length ratio of T13 also includes T11. When the output of comparator 18, at node 20 changes state, the switch is off. The device T9 connects the gate electrode of T11 to the ground potential to turn off device T11.

Switch means 16 is similar to previously described switch means 14, controls FET device T12. To this end, switch means 16 includes an inverter formed from devices T18 and T16. A node 19 is formed between said devices and is connected to the gate of device T8. The drain electrode of device T8 is connected to the node labeled "IN". The source electrode of T8 is connected to the drain electrode of device T10 and the gate electrode of device T12. A P-channel FET device T20 has its drain electrode connected to the drain electrode of T8, its source electrode connected to the source electrode of T8 and the gate electrode of T20 is connected to the input of inverter formed by devices T18 and T16. As will be explained subsequently, a signal on node 24, from comparator 22 activates P-channel device T20. The signal is inverted by the inverter formed by devices T18 and T16. The inverted activate N-channel device T8. When both devices T20 and T8 are conductive, the switch is on and device T12 is tied to the input terminal IN of the circuit. In this state, device T12 has an effect in adjusting the switching threshold of the input stage inverter of the CMOS receiver. If the signal at node 24 is off, the gate of device T12 is coupled to a reference potential, such as ground, by N-channel device T10. In this state, T12 is turned off and has no effect on setting the threshold switching level for the input stage of the CMOS receiver.

Still referring to the sole FIGURE, the signal at nodes 20 and 24 are provided by control means 26. Control means 26 includes a plurality of reference voltage generators (28, 30, 32) and a plurality of comparators (18 and 22) which compare the input of selected ones of the reference voltage generators and generate output signals at nodes 20 and 24. Depending on the accuracy of the switching threshold that is required, more than the number of reference voltage generators shown in the sole FIGURE could be used. However, it has been determined that the three reference voltage generators shown in the sole FIGURE and labeled 28, 30 and 32 provide accurate and satisfactory results. However, this should not be construed as a limitation on the scope of the invention since it is within the skill of one skilled in the art to use more or less reference voltage generators to practice the present invention.

Voltage reference generator 32 includes P-channel FET device T5 and N-channel FET device T6. The devices are connected by their respective drain and source terminals. The source terminal of device T5 is connected to a voltage supply source $V_{DD}$ The gate electrode of device T5 is tied to its drain electrode. The gate electrode of device T6 is tied to its drain electrode and its source electrode is tied to a reference voltage level such as ground. The output node 4 is positioned intermediate the devices T5 and T6. Node 4 is connected to the negative terminal of comparators 18 and 22. Reference voltage generator 32 mimics the inverter (formed by devices T13 and T14) to the input stage of the CMOS receiver means 12. The switching threshold of reference generator 32 is set at approximately 1.4 volts with a switching threshold spread of approximately 800 millivolts. This maximum switching threshold spread is the maximum for the CMOS technology used to develop the CMOS chip. It should be noted that if the technology was such that the switching threshold spread is different, then the reference voltage generator should be designed to have the maximum spread for that particular CMOS chip.

Reference voltage generator 28 is formed from N-channel devices T1 and T2. The source electrode of device T1 is connected to the drain electrode of device T2. The drain electrode of T1 is tied to $V_{DD}$ and its gate electrode is connected to the drain electrode. Likewise, in device T2, the gate electrode is tied to the drain electrode and the source electrode is tied to the reference voltage such as ground. The output at node 1 from reference voltage generator 28 is positioned between T1 and T2 and is connected to positive terminal of comparator 18. Reference voltage generator 28 is designed so that its nominal threshold is 1.2 volts and a maximum spread of approximately 100 millivolts. Stated another way, the nominal threshold voltage and threshold voltage spread for reference voltage generator 28 is proportioned to those for reference voltage generator 32. As stated before, these design choices are exemplary only and a different selection can be made without departing from the spirit or scope of the present invention.

Reference generator 30 includes N-channel devices T3 and T4 connected in series via their respective drain and source electrode. The gate electrode of device T3 is tied to its drain electrode which, in turn, is tied to $V_{DD}$. The gate electrode of device T4 is tied to its drain electrode and its source electrode is tied to a reference voltage level such as ground. Node 2 is positioned intermediate T3 and T4 and is connected to the positive terminal of comparator 22. As is shown in the FIGURE, the controller means 26 has two comparators 18 and 22. Comparator 18 compares the output from reference voltage generator 32 with the output from reference voltage generator 28 while comparator 22 compares the output from reference voltage generator 32 with the output from reference voltage generator 30. The output from both comparators provides the control signals on node 20 and 24 respectively. Therefore, depending on the state of the signal on node 20 and 24, the switch means are either closed or open. If closed, the respective device T11 or T12 is actively connected to the input signal on the node labeled "IN" or if the switches are open, they are tied to a reference potential, such as ground.

Table 1 below shows the W/L ratios for the FET device use in the apparatus shown in the sole FIGURE. As stated above, different values can be used without departing from the spirit and scope of the present invention.

TABLE 1

| Name of Devices | W/L (Ratio |
| --- | --- |
| T1 | 20/9 |
| T2 | 25/9 |
| T3 | 20/9 |
| T4 | 15/9 |
| T5 | 56/9 |
| T6 | 20/9 |
| T7, T8 | 10/4 |
| T9, T10 | 8/4 |
| T11, T12 | 12/4 |
| T13 | 35/4 |
| T14 | 18/6 |
| T15, T16 | 8/4 |
| T17, T18, T19, T20 | 22/4 |

With reference to the specific design shown in the sole FIGURE, transistors T1, T2, T3, T4 form two references that only vary by 100 millivolts due to process and temperature variations. Devices T5 and T6 replicate the input stage of a conventional receiver making node 4 vary by as much as 700–800 millivolts. Nodes 1 and 2 are compared to node 4 through the comparators 22 and 18. The comparators turn on or off transistors T11 and T12. As stated previously, the drain of device T11 and T12 are tied to the output of the first inverter stage of CMOS receiver means 12. With this configuration, there exists three different situations:

Situation 1

For this situation, the voltage at node 4 is lower than the voltage at both nodes 1 and 2. This case would occur if the process parameters are set at values such as to make the NFET device switch at a very low gate source voltage level.

Situation 2 in this situation, the voltage at node 4 is between the voltage at nodes 1 and 2 respectively. This case occurs if all process parameters are set close to or at their nominal values.

Situation 3

In this situation, the voltage at node 4 is higher than both nodes 1 and 2. This situation would occur if the process parameters are set at values such as to make the PFET device switch at a very low gate source voltage level.

Before discussing the relevancy of the three different cases, it should be observed that the width to length ratio of the NFET and PFET devices (T13, T14) of the first inverter in the CMOS receiver means 12 are set at nominal values. With this setting, the switching threshold is higher than the half-way point of the switching threshold spread of the receiver. More accurately, if the spread of the threshold point is represented by $V_{spread}$, and the highest switching threshold point is $V_{hi\ thresh}$ old, then the width to length ratio (W/L) of the PFET and NFET devices are designed so that the switching threshold point is:

$$V_{thresh} = V_{hi\ thresh} - V_{spread}/4$$

With reference to the first case, the output of both comparators 18 and 22 is high, thus turning devices T11 and T12 off and keeping the width to length ratio of T13 as is. Again, the width to length ratio of the NFET device, the first inverter (T13) is set such as, nominally higher than the mid point of the spread, but since the NFET device is stronger due to process parameters, the switching threshold point then gets shifted closer to $V_{hi\ threshold} - V_{spread}/2$.

In the second case, the output of the first comparator will be low but the output of the second one will be high. Therefore. T11 will be on and T12 off. The width of the NFET device (T13) in the input stage of the receiver is thus increased by a value of the width of the device T11, thus compensating for the process parameters which are trying to shift the threshold point higher.

Finally, in the third case, the output of both comparators are low, thus turning T11 and T12 on. The width of the NFET device (T13) is further increased such as to lower the switching threshold point when the process parameters are trying to move it even higher.

While the invention has been particularly shown and described with reference to the preferred embodiment thereof, it will be understood that various changes in form and detail may be made therein without departing from the spirit and scope of the invention.

I claim:

1. A circuit arrangement for interfacing the input of a CMOS receiver with other circuits comprising:
   an inverter having two series connected FET devices, with each FET device having a gate electrode for receiving an input signal and one of its other electrodes coupled to an output node;
   a plurality of FET devices coupled to the output node and in parallel with one of the series-connected FET devices;
   a plurality of switching means, with each switching means having an output node connected to a gate electrode of one of the plurality of FET devices and an input node; and
   a control means for generating a plurality of control signals with each signal coupled to the input of each switching means and representing a difference between a maximum switching threshold voltage level spread for the CMOS technology used to manufacture the CMOS receiver and selected switching threshold voltage level spreads within said maximum threshold voltage level spread.

2. The circuit arrangement of claim 1 wherein the inverter includes a PFET device and an NFET device connected in series.

3. The circuit arrangement of claim 2 wherein the plurality of FET devices includes NFET devices.

4. The circuit arrangement of claim 1 wherein the switching means includes a PFET device having a gate electrode, a drain electrode and a source electrode;
   an NFET device having a drain electrode coupled to the drain electrode of the PFET, a source electrode coupled to the source electrode of the PFET and a gate electrode;
   an inverter circuit having an input coupled to the gate electrode of the PFET and an output coupled to the gate electrode of the NFET; and
   a NFET device having a drain electrode connected to the source electrode of the PFET and the source electrode of the NFET and a gate electrode connected to the gate electrode of the PFET.

5. The circuit arrangement of claim 4 wherein the inverter circuit includes a PFET device connected in series with an NFET device.

6. The circuit arrangement of claim 1 wherein the control means includes a first reference voltage generator having an output;
   a second voltage reference generator having an output;
   a third voltage reference generator having an output;
   a first comparator having an output, a first input coupled to the output of the third voltage reference generator and a second input coupled to the output of the first voltage reference generator; and
   a second comparator having an output; a first input coupled to the output of the third voltage reference generator and a second input coupled to the output of the second voltage reference generator.

7. The circuit arrangement of claim 6 wherein the first voltage reference generator and the second voltage reference generator each including a first NFET device having its gate electrode connected to its drain electrode and a second NFET device having its drain electrode connected to a source electrode of the first NFET and its gate electrode tied to its drain electrode.

8. The circuit arrangement of claim 6 wherein the third reference voltage generator includes a PFET device with its gate electrode tied to its drain electrode and an NFET device having its drain electrode connected to a drain electrode of the PFET device and its gate electrode tied to its drain electrode.

9. A circuit arrangement for interconnecting a CMOS circuit to a driver circuit comprising:
   a CMOS inverter circuit having a PFET device connected in series with an NFET device and an output node connected between the PFET device and the NFET device;
   at least one FET device coupled to the output node and in parallel with the NFET device;
   a control means for generating at least one control signal; said signal being the difference between a maximum range of voltages and at least one selected range of voltage within said maximum range of voltages;
   at least one switch means interconnecting the control means and the at least one FET device, said at least one switch means being responsive to the at least one control signal to enable the at least one FET device if said at least one control signal is in a first state and to disable said at least one FET device if said at least one control signal is in a second state.

10. The circuit arrangement of claim 9 wherein the maximum range of voltages includes the maximum threshold voltage spread for the CMOS inverter circuit.

11. The circuit arrangement of claim 10 wherein the at least one selected range of voltage includes a value proportional to the maximum threshold voltage spread for the CMOS inverter.

12. The circuit arrangement of claim 10 wherein the maximum threshold voltage spread is approximately 800 mV.

13. The circuit arrangement of claim 11 wherein the value is 100 mV.

* * * * *